(12) United States Patent
Sato et al.

(10) Patent No.: US 7,961,439 B2
(45) Date of Patent: *Jun. 14, 2011

(54) HIGH-FREQUENCY OSCILLATION ELEMENT, MAGNETIC INFORMATION RECORDING HEAD, AND MAGNETIC STORAGE DEVICE

(75) Inventors: Rie Sato, Kanagawa (JP); Koichi Mizushima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/878,387

(22) Filed: Jun. 29, 2004

(65) Prior Publication Data
US 2005/0023938 A1   Feb. 3, 2005

(30) Foreign Application Priority Data
Jun. 30, 2003 (JP) ................... 2003-188875

(51) Int. Cl.
*G11B 5/39* (2006.01)
(52) U.S. Cl. ...................................... 360/324
(58) Field of Classification Search ........... 360/324.1, 360/324, 324.11
See application file for complete search history.

(56) References Cited

U.S. PATENT DOCUMENTS

| | | | |
|---|---|---|---|
| 5,390,061 A * | 2/1995 | Nakatani et al. | 360/324.2 |
| 6,002,553 A * | 12/1999 | Stearns et al. | 360/324 |
| 6,219,209 B1 * | 4/2001 | Gill | 360/324.11 |
| 6,252,750 B1 * | 6/2001 | Gill | 360/324.11 |
| 6,271,997 B1 * | 8/2001 | Gill | 360/324.12 |
| 6,275,363 B1 * | 8/2001 | Gill | 360/324.2 |
| 6,317,297 B1 * | 11/2001 | Tong et al. | 360/324.11 |
| 6,381,107 B1 * | 4/2002 | Redon et al. | 360/324.2 |
| 6,469,879 B1 * | 10/2002 | Redon et al. | 360/324.2 |
| 6,621,665 B1 * | 9/2003 | Gill | 360/324.11 |
| 7,580,227 B2 * | 8/2009 | Sato et al. | 360/313 |
| 2002/0051380 A1 * | 5/2002 | Kamiguchi et al. | 365/158 |
| 2002/0097538 A1 * | 7/2002 | Seyama et al. | 360/324.11 |
| 2003/0179514 A1 * | 9/2003 | Pinarbasi | 360/324.11 |
| 2003/0184918 A1 * | 10/2003 | Lin et al. | 360/314 |
| 2004/0008450 A1 * | 1/2004 | Gill | 360/324.11 |
| 2004/0207959 A1 * | 10/2004 | Saito | 360/324.1 |
| 2004/0207962 A1 * | 10/2004 | Saito et al. | 360/324.11 |
| 2004/0212933 A1 * | 10/2004 | Kim et al. | 360/324.11 |

FOREIGN PATENT DOCUMENTS
JP          2002-26417          1/2002

* cited by examiner

*Primary Examiner* — Craig A. Renner
(74) *Attorney, Agent, or Firm* — Kimble Intellectual Property Law, PLLC

(57) ABSTRACT

A high-frequency oscillation element has a ferromagnetic material which exhibits thermal fluctuation of magnetization and generates spin fluctuations in conduction electrons, a nonmagnetic conductive material which is laminated on the first magnetic material and transfers the conduction electrons, a magnetic material which is laminated on the nonmagnetic conductive material, generates magnetic resonance upon injection of the conduction electrons, and imparts magnetic dipole interaction to magnetization of a neighboring magnetic area by means of magnetic vibration stemming from the magnetic resonance, a first electrode electrically coupled with the first magnetic material, and a second electrode electrically coupled with the second magnetic material.

20 Claims, 6 Drawing Sheets

HIGH-FREQUENCY OSCILLATION ELEMENT, MAGNETIC INFORMATION RECORDING HEAD, AND MAGNETIC STORAGE DEVICE

CROSS-REFERENCE TO RELATED APPLICATIONS

This application is based upon and claims the benefit of priority from the prior Japanese Patent Applications No. 2003-188875, filed on Jun. 30, 2003, the entire contents of which are incorporated herein by reference.

BACKGROUND OF THE INVENTION

1. Field of the Invention

The present invention relates to a high-frequency oscillation element to be used in a magnetic sensor, as well as to a magnetic information recording head and a magnetic storage device, both pertaining to high-density magnetic recording.

2. Description of the Related Art

Since the inception of a GMR head employing a giant magnetoresistance effect (GMR effect), recording density of magnetic recording has been increased at a rate of about 100% per year. GMR elements include a spin-valve-type element and an artificial-lattice-type element.

The spin-valve-type element has a multilayer film including a ferromagnetic layer/nonmagnetic layer/ferromagnetic layer. The magnetization of one of the ferromagnetic layers is fixed by applying, e.g., an exchange bias magnetic field from an antiferromagnetic film, whereby the magnetization direction of the other ferromagnetic layer is reversed by an external magnetic field (signal magnetic field). Accordingly, a relative angle between magnetization directions of the two ferromagnetic layers changes, and this change can be detected as a change in the element resistance. A GMR element of spin-valve type exhibits a change in magnetic resistance of about 10% and is considered to be able to achieve a recording density of 200 Gbit/inch$^2$ or thereabouts.

To cope with higher-density magnetic recording, TMR elements employing a tunnel magnetoresistance effect (TMR effect) have been developed. A TMR element has a multilayer film including a ferromagnetic layer/tunnel dielectric layer/ferromagnetic layer. When a voltage is applied between the two ferromagnetic layers, a tunnel current flows into the TMR element.

The phenomenon of the magnitude of a tunnel current changing in accordance with the magnetization direction of the two ferromagnetic layers can be utilized in detecting a change in the relative angle between the two ferromagnetic material layers as a change in tunnel resistance. An obtained MR ratio of the TMR element is approximately 50% maximum and can be considered to achieve a recording density of 300 Gbit/inch$^2$.

In addition to the above, an element using spin-polarized current in a ferromagnetic material has been suggested. For example, in a spin injection three-terminal element, a transistor which performs gating by injecting spin-polarized current from a ferromagnetic material electrode into channels has been suggested (see JP-A-2002-26417).

Magnetic recording at 500 Gdpsi or more requires a bit size of about 50 nm or less. Therefore, a medium having large coercive force is used for reducing thermal fluctuations of micro-magnetization. For this reason, at the time of writing of magnetic information, a heat assistance method is employed for simultaneously supplying a magnetic field and heat to a bit area of a medium where the magnetic information is to be recorded. The heat assistance method requires a high-speed characteristic of adapting to travel of a head at a frequency on the order of GHz, as well as requiring heat radiation having a large power density having locality corresponding to a bit area of tens of square nanometers. However, no specific idea has yet been put forth.

The same read/write problem is also found in magnetic random access memory (MRAM), which is one type of solid-state memory. When storage information is written in a memory cell of the MRAM, the information is written through use of a current magnetic field derived from two current lines. However, the MRAM is highly integrated, and it has been pointed out that crosstalk arises in the current magnetic field derived from adjacent current lines, thereby hindering high-speed storage of accurate information in a fine memory cell.

SUMMARY OF THE INVENTION

As described above, the heat assistance method for high-density magnetic recording encounters a difficult problem of implementing energy radiation. The present invention has been conceived in view of the circumstances. An object of the invention is to provide a high-frequency oscillator based on a new operation principle. Another object of the invention is to provide a high-frequency oscillator which enables to increase selectivity of a memory cell required when data are written in highly-integrated MRAM, thereby diminishing crosstalk.

A high-frequency oscillation element according to the present invention has: a first magnetic material exhibiting thermal fluctuation of magnetization which generates spin fluctuation in conduction electrons; a nonmagnetic conductive material which is laminated on the first magnetic material and which transfers the conduction electrons; a second magnetic material which is laminated on the nonmagnetic conductive material, generates magnetic resonance upon injection of the conduction electrons, and effects magnetic dipole interaction to magnetization of a neighboring magnetic area by means of magnetic vibration stemming from the magnetic resonance; a first electrode electrically coupled with the first magnetic material; and a second electrode electrically coupled with the second magnetic material.

The magnetic element is characterized by utilizing thermal fluctuation inevitably stemming from magnetization of a first minute magnetic material and by introducing into a second magnetic material spin fluctuation of conduction electrons derived from thermal fluctuation of magnetization of the first magnetic material by way of the nonmagnetic material. The spin fluctuation of the injected conduction electrons acts as an effective high-frequency magnetic field on the second electrode through an interaction such as "sd" exchange interaction, thereby inducing magnetic resonance in the second magnetic material.

The energy of the magnetic vibration having developed in the magnetic material because of magnetic resonance is immediately transmitted to magnetization of a neighboring medium or magnetization of a memory cell of the MRAM by means of the magnetic dipole interaction, thereby enabling an increase in the temperature of the medium or the memory cell. As a result, high-speed local recording/storage of magnetic information becomes possible.

DETAILED DESCRIPTION OF THE PREFERRED EMBODIMENTS

Figure 1:
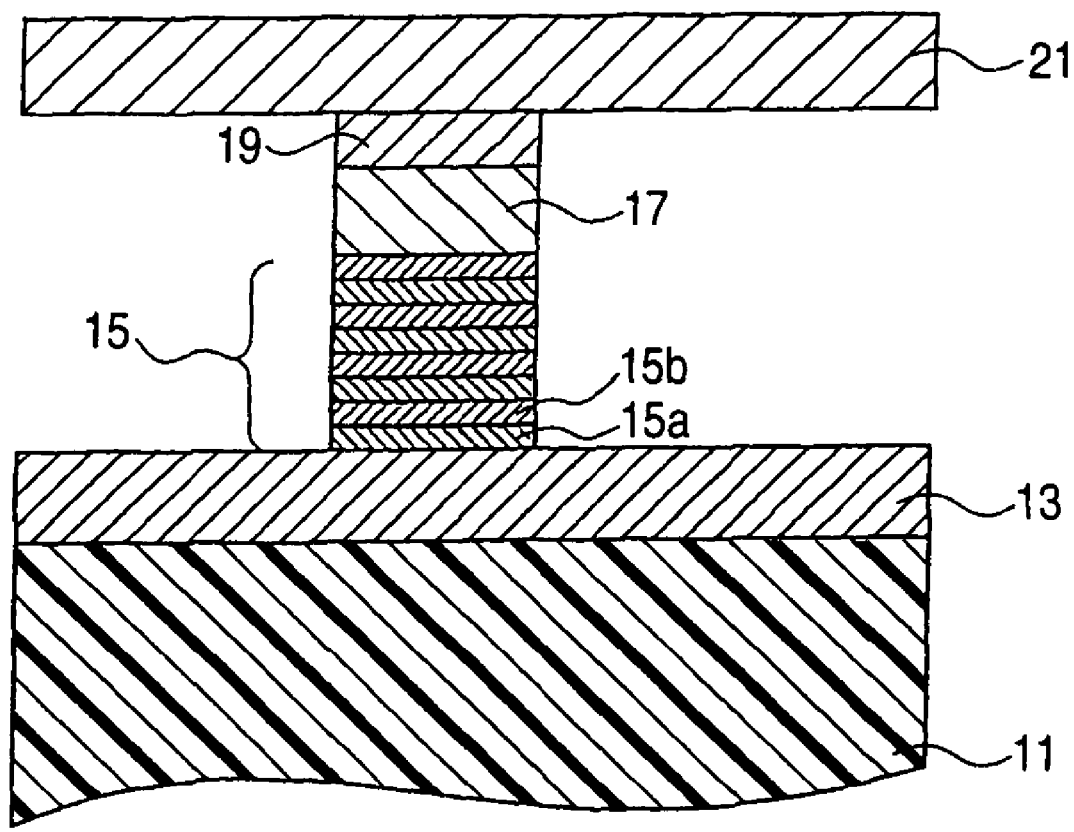
FIG. 1 is a diagrammatic cross-sectional view for explaining a high-frequency oscillation element according to a first embodiment of the invention.

Embodiments of the invention will be described in detail hereunder by reference to the drawings. In the following descriptions, identical constituent elements are assigned the same reference numerals, and repeated descriptions thereof are omitted. Respective drawings are diagrammatic views, which may represent shapes, sizes, and ratios that differ from those of the actual apparatus. However, the shapes, sizes, and ratios can be changed during actual manufacture of elements in consideration of the following descriptions and the known art.

First Embodiment

FIG. 1 is a diagrammatic cross-sectional view for explaining a high-frequency oscillation element according to a first embodiment of the invention.

This high-frequency oscillation element is formed on a substrate 11 shown in FIG. 1, and has a lower electrode 13 serving also as a radiating plate, an artificial lattice film (also called an "artificial antiferromagnetic film") formed on the lower electrode 13, a nonmagnetic film 17, a ferromagnetic film 19, and an upper electrode 21 serving also as a radiating plate. The lower electrode 13 and the upper electrode 21 serve also as the radiating plates and, therefore, extend horizontally across the paper plane of FIG. 1 and are connected at their end portions to a current supply circuit which controls a current flow to the element, or the like.

The lower electrode 13 and the upper electrode 21 can be provided with a radiating plate and wiring independently from the electrodes. In such a case, the heat-radiating plate can be formed in a plane parallel to the surfaces of the electrodes 13 and 21 and the film surface of the ferromagnetic film 19 (i.e., within a plane horizontally extending across the drawing paper in the sectional view of FIG. 1).

The element described above actively utilizes thermal fluctuation, which inevitably arises in a micro-ferromagnetic material. Specifically, the element is characterized in that the artificial antiferromagnetic film 15 is located adjacent to the ferromagnetic film 19 with the nonmagnetic film 17 therebetween is provided with conduction electrons exhibiting spin fluctuation stemming from thermal fluctuation of magnetization of the ferromagnetic film 19. The spin fluctuation of the injected conduction electrons acts as an effective high-frequency magnetic field through "sd" exchange interaction in the artificial antiferromagnetic film 15, thereby inducing magnetic resonance in the artificial antiferromagnetic film 15.

The energy of magnetic vibration developed in the artificial antiferromagnetic film 15 by means of magnetic resonance is quickly transmitted to magnetization of a neighboring medium by means of the magnetic pole interaction, thereby increasing the temperature of a corresponding magnetic bit area. An effective measure is to place the magnetic medium in the vicinity of a high-frequency oscillation element such that the magnetization direction of artificial antiferromagnetic film 15 is made parallel to the magnetization direction of the medium. A magnetic medium or a magnetic storage layer of a memory cell of MRAM is positioned such that the surface of the magnetic medium or magnetic storage layer becomes parallel to the drawing paper of FIG. 1. Thus, the element of the present embodiment can be used as a high-frequency oscillation element which induces a local temperature increase.

The high-frequency oscillation element of the embodiment utilizes thermal fluctuation of magnetization of the ferromagnetic film 19, and so that an oscillation characteristic is not decreased even when a junction area between elements (i.e., a junction area between the artificial antiferromagnetic film 15, the nonmagnetic film 17, and the ferromagnetic film 19) is reduced.

In the embodiment, on the assumption that a reading magnetic head adaptable to 1 Tb/inch$^2$ is taken as an example of a micro-ferromagnetic material, the ferromagnetic film 19 is set so as to have an area of approximately 30×30 nm$^2$ and a thickness of approximately 1 nm. The areas of the artificial antiferromagnetic film 15 and the nonmagnetic film 17 can also be made equal to that of the ferromagnetic film 19. That is, the junction area between the elements assumes approximately 30×30 nm$^2$.

Moreover, in this embodiment, the artificial antiferromagnetic film 15, the nonmagnetic film 17, and the ferromagnetic film 19 are deposited in the shape of a square prism, wherein the four side faces of the square prism are surrounded by nonmagnetic materials (not shown). The multilayer film can be changed to another shape, such as a circular cylinder, a triangular prism, or a polygonal prism, as required.

Fe, Co, Ni, an alloy thereof, and a conductive magnetization compound, such as $Fe_3O_4$ or $LaSrMnO_3$ or the like, can be used for the ferromagnetic film 19.

Noble metal, such as Al, Pt, Au, Ag, or Cu, or non-magnetic transition metal, such as Cr, Ru, or Pd, can be used for the nonmagnetic film 17.

The thickness of the nonmagnetic film 17 can be set within the range of approximately 1 nm to tens of nanometers; e.g., approximately 5 nm. The nonmagnetic film 17 interrupts the exchange interaction which occurs between the ferromagnetic film 19 and the artificial antiferromagnetic film 15, while simultaneously transferring the spin fluctuation of the conduction electrons generated in the ferromagnetic film 19 to the artificial antiferromagnetic film 15.

The artificial antiferromagnetic film 15 is an artificial lattice film where ferromagnetic layers 15a and nonmagnetic layers 15b are alternately laminated. The two ferromagnetic layers 15a that sandwich a given nonmagnetic layer 15b are coupled so that their magnetization directions are substantially antiparallel. In other words, the two ferromagnetic layers 15a are coupled antiferromagnetically.

Fe, Co, Ni, or an alloy thereof can be used for the ferromagnetic layer 15a of the artificial antiferromagnetic film 15.

A noble metal, such as Pt, Au, Ag, or Cu, or a nonmagnetic transition metal, such as Cr, Ru, Rh, Mo, or W, can be used for the nonmagnetic layer 15b.

For the reason described later, the thickness of the ferromagnetic material layer 15a preferably falls within the range of approximately 0.1 nm to approximately 1 nm, e.g., approximately 0.5 nm. Since the nonmagnetic material layer 15b controls the intensity of antiferromagnetic coupling between the two neighboring ferromagnetic material layers 15a, thickness of the nonmagnetic material layer 15b can be set, e.g., within the range of approximately 0.2 nm to 2 nm. Overall thickness of the artificial antiferromagnetic material film 15 is set at several tens of nm, e.g.; approximately 30 nm. The coupling intensity of the two neighboring ferromagnetic material layers 15a is set at, e.g., 0.5 to 10 erg/cm² by means of adjusting the thicknesses and materials of the ferromagnetic material layer 15a and/or the nonmagnetic material layer 15b.

For the electrodes 13 and 21, a film having a metal such as Al, Cu, Au, or Ag is used. When the electrodes 13 and 21 also serve as magnetic fields, the above metal film and a film of a known heat radiating material film are formed in the form of a multilayer.

A substrate material which is generally suitable for forming a high-frequency oscillation element and a magnetic element; e.g., a substrate of a nonmagnetic insulating material including silicon, $Al_2O_3$, or TiC, is used for the substrate 11.

Thermal fluctuation of magnetization of the ferromagnetic material film 19 will now be described.

Figure 2A:
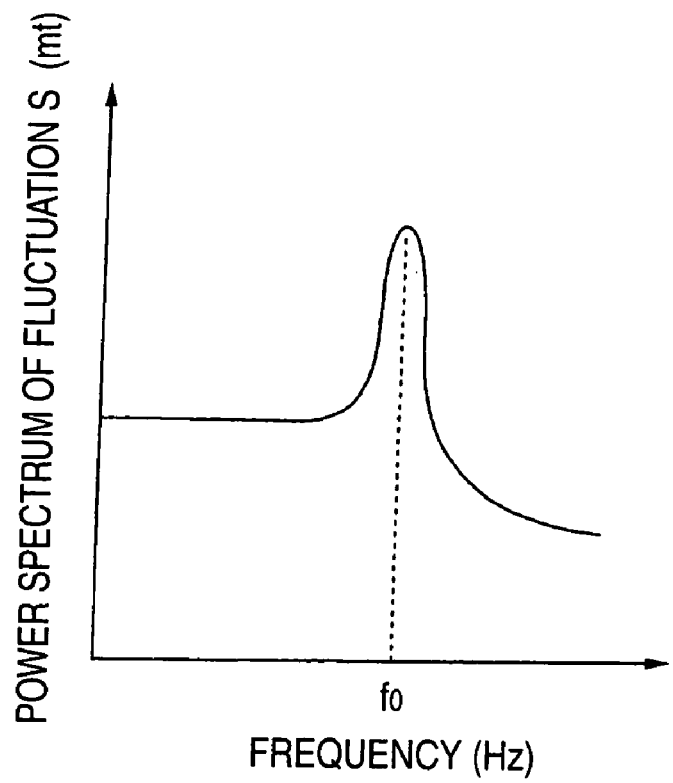
FIGS. 2A and 2B are views for describing thermal fluctuation stemming from magnetization of a ferromagnetic material and a power spectrum.
Figure 2B:
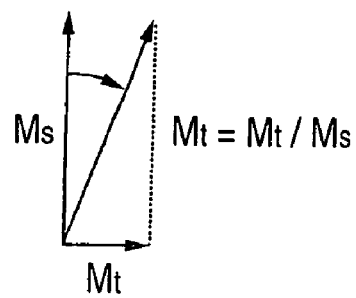

FIG. 2A shows a schematic power spectrum $S_{<mt>}$ of thermal fluctuation of the ferromagnetic material film 19. FIG. 2B shows magnetization components within the film plane of the ferromagnetic material film 19, where $M_s$ is a saturation magnetization of a ferromagnetic material 19, and $M_t$ is a transverse component which is perpendicular to the saturation magnetization of a ferromagnetic material film 19. Specifically, $m_t$ shown in FIG. 2B denotes an angle (radian) of thermal fluctuation of magnetization of the ferromagnetic material film 19.

Thermal fluctuation of magnetization of the ferromagnetic material film 19 at a temperature "T" (Kelvin) can be represented by the following equation (1) using a power spectrum $S_{<mt>}$ of the mean square $<m_t^2>$ of $m_t$ $$(i, e., M_t/M_s). \qquad (1)$$

$$<m_t^2> = \int S_{<mt>} df$$

$$S_{<mt>} = \frac{2kT}{\pi f} \frac{\chi''_{FM}}{M_S^2 V_{FM}}$$

$$\chi''_{FM} = \frac{\gamma^2 M(\alpha/\gamma) 2\pi f}{(2\pi f_0 - 2\pi f)^2 + \gamma^2(\alpha/\gamma)^2 (2\pi f)^2}$$

$$2\pi f_0 = \gamma \sqrt{4\pi M_s(H + H_k)}$$

In the equation (1), $\chi''_{FM}$ is the imaginary component of the high-frequency susceptibility of the ferromagnetic material film 19; $V_{FM}$ is the volume of the ferromagnetic material film 19; α is Gilbert damping constant; γ (i.e., 19×106 rad/s Oe) is the gyromagnetic ratio; $f_0$ is the resonance frequency of the ferromagnetic material film 19; H is the external magnetic field of the ferromagnetic material film 19; and $H_K$ is the anisotropic magnetic field of the ferromagnetic material film 19.

The equation (1) and FIG. 2A show that a high-frequency susceptibility $\chi''_{FM}$ increases in the vicinity where the external magnetic field frequency "f" is close to the resonance frequency f. They also show that the power spectrum $S_{<mt>}$ of magnetization of the ferromagnetic material film 19 increases as well.

In a case where Fe (saturation magnetization $M_S$=1,700 Gauss) having a volume $V_{FM}$ of approximately 30×30×1 m³ is used as a ferromagnetic material film 19, the resonance frequency $f_0$ is assumed to be 10 GHz, and Gilbert damping constant α is assumed to be 0.01, the thermal fluctuation of magnetization of the ferromagnetic material film 19 $<m_t^2>^{1/2}$ can be represented as shown in the following equation (2) where the external magnetization field frequency "f" is equal to $f_0$, and the band width is Δf.

$$\sqrt{<m_t^2>} = \sqrt{S_{<mt>}(f_0)f\Delta} = 0.1 \text{ radian} = 6° \qquad (2)$$

In the equation (2), the band width Δf is set at the half bandwidth of the resonance line of the ferromagnetic material film 19, as follows: $\Delta f = 2\alpha f_0 = 2 \times 10^8$ Hz.

Spin fluctuations stemming from thermal fluctuation of magnetization of the ferromagnetic film 19 arise in the conduction electrons in the ferromagnetic film 19 exhibiting such magnetization fluctuations. The conduction electrons exhibiting spin fluctuations are transferred by means of the current flowing through the multilayer film, and then injected into the artificial antiferromagnetic material film 15 after passing through the nonmagnetic material film 17. The spin fluctuation of the injected conduction electrons acts as an effective high-frequency magnetic field through "sd" exchange interaction on the artificial antiferromagnetic material film 15, thereby inducing magnetic resonance on the artificial antiferromagnetic material film 15.

In addition to depending on the magnitude of fluctuation $S_{<mt>}$, the intensity of the effective high-frequency magnetic field depends on spin polarization degree P of conduction electrons in the ferromagnetic material film 19; spin-transfer efficiency of the nonmagnetic material film 17; intensity $J_{sd}$ of "sd" exchange interaction in the artificial antiferromagnetic material film 15; current density "i"; junction area "S" (i.e., a junction area of the artificial antiferromagnetic material film 15 and the nonmagnetic material film 17, and having the same size as the element in the embodiment); volume of the artificial antiferromagnetic material film 15 $V_{AF}$; and attenuation time $\tau_s$ of the spin injected into the artificial antiferromagnetic material 15.

When the spin-transfer efficiency of the nonmagnetic material thin-film 17 is set at approximately 100% and the thickness of the artificial antiferromagnetic material film 15 is set approximately equal to an attenuation length $\lambda_{AF}$ of the spin transverse component, the effective magnetic field $H_{eff}$ can be represented by the following equation (3).

$$H_{eff}^2 \cong S_{<mt>} \left[ \frac{1}{N} \left( \frac{iS\tau_s}{V_{AF}} \right) \left( \frac{2J_{sd}}{g\mu_B} \right) \left( \frac{P}{2} \right) \right]^2 \Delta f \qquad (3)$$

In the equation (3), N is the magnetic ion density in the ferromagnetic material layer 15a that forms the artificial antiferromagnetic material film 15; "g" is a "g factor" (approximately 2); and $\mu_B$ is the Bohr magneton. Inducing magnetic resonance on the artificial antiferromagnetic material 15 requires an effective high-frequency magnetic field (i.e., spin fluctuation of conduction electrons) which is perpendicular (a lateral direction) to the magnetization. Accordingly, the spin relaxation time in the equation (3) represents the relaxation time $\tau_s$ (sec) of the transverse component.

According to recent studies, when conduction electrons are injected into a ferromagnetic material through a nonmagnetic material, spins thereof receive torque caused by magnetization of the ferromagnetic material, and the transverse components (perpendicular-to-magnetization components) of the spins are attenuated rapidly in the vicinity of the interface. When up spins and down spins in the ferromagnetic material are assumed to have Fermi wave numbers $K_{F\uparrow}$ and $K_{F\downarrow}$ respectively, the attenuation length $\lambda_{FM}$ of the transverse components is approximately $2\pi/|K_{F\uparrow}-K_{F\downarrow}|$. For example, attenuation length $\lambda_{FM}$ of Fe is approximately 3 nm. Meanwhile, for an antiferromagnetic material such as Mn, a relation $K_{F\uparrow}=K_{F\downarrow}$ stands, wherein torque is not applied, and the attenuation length $\lambda_{Fm}$ is several tens of nanometers or longer.

Also in the case of the artificial antiferromagnetic material film 15 of the embodiment, when the thicknesses of the ferromagnetic material layers 15a which form the artificial antiferromagnetic material 15 are sufficiently thin in comparison with the attenuation length $\lambda_{FM}$ (approximately 3 nm), the attenuation length $\lambda_{AF}$ becomes several tens of nanometers or longer as in the case of a general antiferromagnetic material. The reason for this is that the electrons injected into the artificial antiferromagnetic material 15 can pass through the first ferromagnetic material layer 15a without being attenuated significantly by the spin transverse components, and in the next ferromagnetic material layer 15a, where the magnetization direction is opposite, the spin transverse components are recovered by application of a torque of the opposite direction.

The relaxation time $\tau s$ of transverse components of electron spins in the artificial antiferromagnetic material film 15 can be estimated from the relationship expressed by the following equation (4).

$$\left.\begin{array}{l}\lambda_{AF} = \sqrt{D\tau_S} \\ D = \frac{1}{3}V_F l\end{array}\right\} \quad (4)$$

In the equation (4), "D" is a diffusion coefficient (approximately 10 cm$^2$/s), $V_F$ is the Fermi velocity of electrons, and "l" is a mean free path of electrons. When the parameters are set as follows: $\lambda_{AF}$ is approximately 30 nm, "l" is approximately 1 nm, and $V_F$ is approximately $10^8$ cm/s, $\tau s$ can be estimated to be approximately $3\times10^{-12}$ sec.

For other parameters in the equation (3), $J_{sd}$ is approximately 0.5 eV, N is approximately $8\times10^{22}$/cm$^3$, and P is approximately 0.4. In the case where a junction area "S" is $30\times30$ nm$^2$ and the volume $V_{AF}$ of the artificial antiferromagnetic material film 15 is $30\times30\times10$ nm$^3$, the effective magnetic field $H_{eff}$, where $f_0$ is 10 GHz, is approximately $(4\times10^{-4})$ i (Oe), wherein $\Delta f=2\alpha f_0$ is assumed to be approximately $2\times10^8$ Hz in the equation (3).

Specifically, when the current density "i" is about $10^5$ A/cm$^2$, a strong high-frequency magnetic field of tens of oersteds is understood to arise in the artificial antiferromagnetic material film 15. Here, $S_{<mt>}$ is $5\times10^{-22}$ Hz$^{-1}$, $\mu_B$ is $9.27\times10^{-21}$ erg/gauss.

In general, when a high-frequency magnetic field $H_{rf}$ having frequency "f" is applied on an antiferromagnetic material of volume $V_{AF}$, energy P absorbed by magnetic resonance per unit of time can be represented by the following equation (5) below. $\chi''_{AF}$ in the equation (5) is the imaginary component of a high-frequency susceptibility of the antiferromagnetic material.

$$P = \frac{1}{2}\chi''_{AF}H_{rf}^2(2\pi f)V_{AF} \quad (5)$$

In the artificial antiferromagnetic material film 15, not a single frequency but a distributed frequency exists in the magnetic field. Accordingly, the absorption energy per unit time can be represented by the following equation (6) below, which was obtained by replacing some terms of the equation (5).

$$P \cong \frac{1}{2}\int df \chi''_{SAF}S_{<mt>}\left[\frac{1}{N}\left(\frac{iS\tau_S}{V_{AF}}\right)\frac{2J_{sd}}{g\mu_B}\left(\frac{P}{2}\right)\right]^2(2\pi f)V_{AF} \quad (6)$$

In the equation (6), $\chi''_{AF}$ is the imaginary part of the complex susceptibility of the artificial antiferromagnetic material film 15 represented by the following equation (7).

$$\left.\begin{array}{l}\chi''_{SAF} \cong \sqrt{\frac{H_A}{2H_E}}\left\{\dfrac{\gamma^2 M_{sub}\left(\dfrac{\alpha'}{\gamma}\right)(2\pi f)}{(2\pi f_1 - 2\pi f)^2 + \gamma^2\left(\dfrac{\alpha'}{\gamma}\right)^2(2\pi f)^2}\right\} \\ 2\pi f_1 = \gamma\sqrt{2H_E H_A}\end{array}\right\} \quad (7)$$

In the equation (7), $H_A$ is an anisotropic magnetic field; $H_E$ is an exchange magnetic field acting between the ferromagnetic material layers 15a; $M_{sub}$ is sub-lattice magnetization of the artificial antiferromagnetic material film 15; $f_1$ is the resonance frequency of the artificial antiferromagnetic material film 15; and $\alpha'$ is Gilbert damping constant of the ferromagnetic material layer 15a.

When the same material as used for the ferromagnetic material film 16, such as Fe, is used for the ferromagnetic material layers 15a, terms of the equation (7) are assumed as follows: $f_1=f_0=10$ GHz; $\alpha'=\alpha=0.01$; $H_A$ is approximately $4\times10^2$ Oe; $H_E$ is approximately $1.5\times10^4$ Oe; and $M_{sub}$ is substantially equal to $(M_s/2) L_{Fe}/(L_{Fe}+L_N)$, the following equation (8) below is obtained from the equations (6) and (7). In the equation (8), $L_{Fe}$ and $L_N$ are the thicknesses of the ferromagnetic material layer 15a and nonmagnetic material layer 15b of the artificial antiferromagnetic material film 15, respectively, and I (i.e., iS) is the current that flows in the element.

$$P \cong (2.1\times10^2)\left(\frac{L_{Fe}}{L_{Fe}+L_N}\right)I^2 \text{ watt} \quad (8)$$

On the assumption that $L_{Fe}/(L_{Fe}+L_N)=2/3$, P is estimated to be about 140 I$^2$ watt. When an electric current of 0.5 mA is caused to flow, power to be subjected to resonance absorption by the artificial antiferromagnetic material film 15 through resonance is about 40 μW. The majority of the power having undergone resonance absorption is dissipated by way of the radiating plate. However, several percent of the absorbed power (about 1 μW) act on magnetization of a medium as near field interaction due to magnetic dipole. Since the cross sectional area of the element is about 30×10 nm², the power density absorbed by the medium is understood to be about 3×10⁵ watt/cm².

On the assumption that the operation frequency of magnetic recording is taken as 300 MHz, the energy absorbed during a period of one cycle (about 3 ns) amounts to about $10^{-6} \times (3 \times 10^{-9}) = 3 \times 10^{-15}$ J. Heat capacity of one bit in the medium amounts to $4 \times 10^{-18}$ J on the assumption that the volume of the medium is taken as about 30×30×1 nm³; specific heat is taken as 0.1 cal/g.deg; and density of the medium is 8 g/cm³. Therefore, an increase in the temperature of a desired bit due to absorption of energy amounts to about 1000° C. This estimation is obtained while thermal conduction of the medium is neglected. Even when thermal conduction is taken into consideration, a temperature increase of several hundred degrees centigrade is expected.

The equation (2) holds when the thickness of the artificial antiferromagnetic material film 15 is substantially equal to the attenuation length $\lambda_{AF}$ of a lateral component of a spin. Here, the effective magnetic field in the artificial antiferromagnetic material film 15 is proportional to the density of introduced spin. The sensitivity of the element can be enhanced, by means of reducing the thickness of the artificial antiferromagnetic material film 15 and providing an adequate barrier B, to thus confine the implanted electrons in the artificial antiferromagnetic material film 15.

Figure 8:
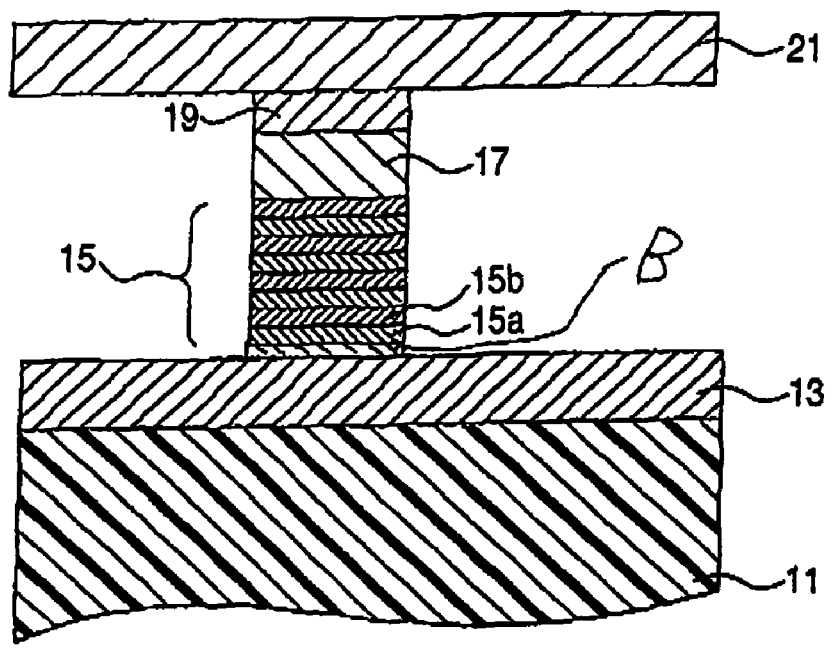
FIG. 8 is a diagrammatic cross-sectional view for explaining a high-frequency oscillation element according to another embodiment of the invention.

As shown in FIG. 8, the barrier B is inserted in the form of, e.g., a layer. The layer may also be formed between the lower electrode 13 and the artificial antiferromagnetic material film 15. Alternatively, the barrier B may be interposed between the artificial antiferromagnetic material film 15 and the nonmagnetic film 17 or on upper and lower surfaces of the artificial antiferromagnetic material film 15.

For instance, when the thickness of the artificial antiferromagnetic material film 15 is reduced from about 10 nm to about 3 nm and a barrier B having electron transmittance of about one-tenth is provided on the upper and lower surfaces of the artificial antiferromagnetic material film 15, the absorbing power is increased by a factor of about three. Any of CuO, Al₂O₃, MgO, AlN, HfN, Si, Ge, and ZnS can be used as the barrier B.

As a result of bonding between the ferromagnetic layers 15a in the artificial antiferromagnetic material film 15 being weakened to form a substantial assembly of ferromagnetic materials, $\chi''_{SAF}$ can be increased severaltimes, thereby greatly enhancing the absorbing power achieved at the time of resonance (i.e., the rate of change in resistance). In order to weaken interlayer bonding between the ferromagnetic layers 15a (about 0.1 erg/cm²), the thickness of, e.g., a noble metal nonmagnetic material, is set to about 5 nm or more.

Even when a ferromagnetic film having a thickness of about 3 nm is used in lieu of the artificial antiferromagnetic material film 15, the characteristic of the ferromagnetic film becomes inferior to that of the artificial antiferromagnetic material film 15, whereby there is obtained an element sufficiently functioning as a micro-oscillator. Such a ferromagnetic material includes a CoCr alloy such as CoCrTa, CoCrTaPt or CoCrTaNb, a Co multilayer film such as Co/Pd, Co/Pd, Co/Pt or CoCrTa/Pd, a CoCrPt alloy, a FePt alloy, a SmCo alloy, and a TbFeCo alloy, or the like.

As mentioned above, the high-frequency oscillator is not only applied to a magnetic head, but also utilized for recording/writing data on highly-integrated solid-state magnetic memory, whereby selectivity of a bit is increased. Therefore, writing of data with involvement of little crosstalk becomes feasible.

Here, an oscillator based on the totally same principle as that mentioned above can be configured even when a micro-antiferromagnetic material is used in place of the micro-ferromagnetic material and when an antiferromagnetic material is used as the artificial antiferromagnetic material.

An oscillation element whose frequency is higher than the above-described element (on the order of THz) can be configured through use of the antiferromagnetic material, because the magnetic resonance frequency of the antiferromagnetic material is high. However, both thermal fluctuations stemming from magnetization and a high-frequency band magnetic ratio are decreased in a band of the order of THz where the antiferromagnetic material is used. For this reason, the output from the oscillator becomes about one-hundredths of the output from the above-described microwave oscillator. Specifically, there is obtained an oscillator having an output of about 10 nW and power density of 3×10³ W/cm².

FIRST EXAMPLE

A first example of the present invention will now be described by reference to a diagrammatic cross-sectional view of FIG. 3.

<Evaluation of Thermal Fluctuation of Ferromagnetic Material>

In this example, thermal fluctuations stemming from magnetization of the ferromagnetic material were measured.

First, a multilayer film was formed on a silicon substrate 31 by means of sputtering film growth and electron lithography. This multilayer film has, in sequence from the substrate 31, a non-magnetic Cu layer 33, a ferromagnetic Co layer 35; a non-magnetic Cu layer 37; a ferromagnetic Fe layer 39; a non-magnetic Cu layer 41; a non-magnetic Au layer 43; and a non-magnetic Cu layer 45.

Thicknesses of the respective layers are as follows: the Cu layer 33 has a thickness of about 100 nm; the Co layer 35 has a thickness of about 50 nm; the Cu layer 37 has a thickness of about 30 nm; the Fe layer 39 has a thickness of about 1 nm; the Cu layer 41 has a thickness of about 10 nm; the Au layer 43 has a thickness of about 100 nm; the Cu layer 45 has a thickness of about 100 nm. The area of each of junctions between the ferromagnetic Co layer 35 and the ferromagnetic Fe layer 39 and the non-magnetic Cu layers 33, 37, and 41 was set to about 100×100 cm².

The Co layer 35 and the Fe layer 39 were grown by applying a magnetic field of about 10000 e to the inside of the plane of the film, and magnetic uniaxial anisotropy was afforded to these layers.

The element resistance of the multilayer film was 5.2 Ω and had an MR ratio (=ΔR/R) of about 0.8%. An external magnetic field was applied in a magnetization easy direction in a film surface, and a noise spectrum was measured at an element current of about 1 mA. The result of measurement is shown in FIG. 4.

Figure 4:
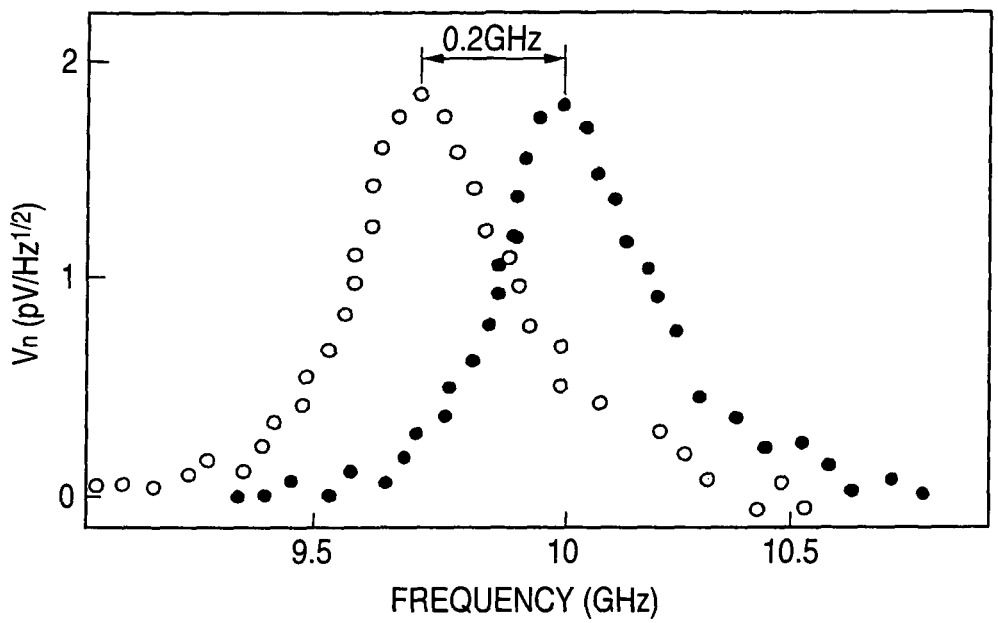
FIG. 4 is a view showing a noise spectrum of the first embodiment.

The horizontal axis in FIG. 4 shows a frequency "f" (GHz) of an applied magnetic field, and the vertical axis shows a noise voltage [pV/(Hz)^{1/2}] per band width. Outlined circles shown in FIG. 4 denote a spectrum obtained when an external magnetic field of about 4100 e was applied to the multilayer film, and solid circles in FIG. 4 denote a spectrum achieved under an external magnetic field of about 4700 e. It is understood that, when the external magnetic field has changed by about 600 e, a peak of the spectrum of the noise voltage has moved by about 0.2 GHz. A Gilbert attenuation coefficient "α" of the Fe layer 39 estimated from the width of the spectrum peak was about 0.02.

A relation ship of the following equation (9) stands between the noise voltage Vn and the magnetization fluctuation $<m_{mt}^2>$.

$$\left[\int V_n^2(f)df\right]^{\frac{1}{2}} = I\Delta R\sqrt{<m_t^2>} \quad (9)$$

An estimation can be formed from the result shown in FIG. 4 in the manner as represented by the following equation (10) provided below.

$$\sqrt{<m_1^2>} = 0.017 \text{radian} = 1.02° \quad (10)$$

Magnetization fluctuations of the Co layer 35 having a thickness of 50 nm can be neglected when compared with the magnetization fluctuations of the Fe layer 39 having a thickness of 1 nm. Therefore, the previously-described magnetization fluctuations can be considered to be magnetization fluctuations of the Fe layer 39.

<Manufacture and Evaluation of Artificial Antiferromagnetic Film>

The artificial antiferromagnetic film was formed on the Si substrate by means of sputtering while being applied with a magnetic field of about 1000 oe. The artificial antiferromagnetic film was formed by alternately laminating the Co layer and the Cu layer 10 times. The thickness of the respective Co layers was set to about 1 nm, and the thickness of the respective Cu layers was set to about 0.5 nm. An antiferromagnetic resonance spectrum of the (Co 1 nm/Cu 0.5 nm)[10] laminate film was observed through use of the magnetic resonance apparatus of an X band.

Figure 5:
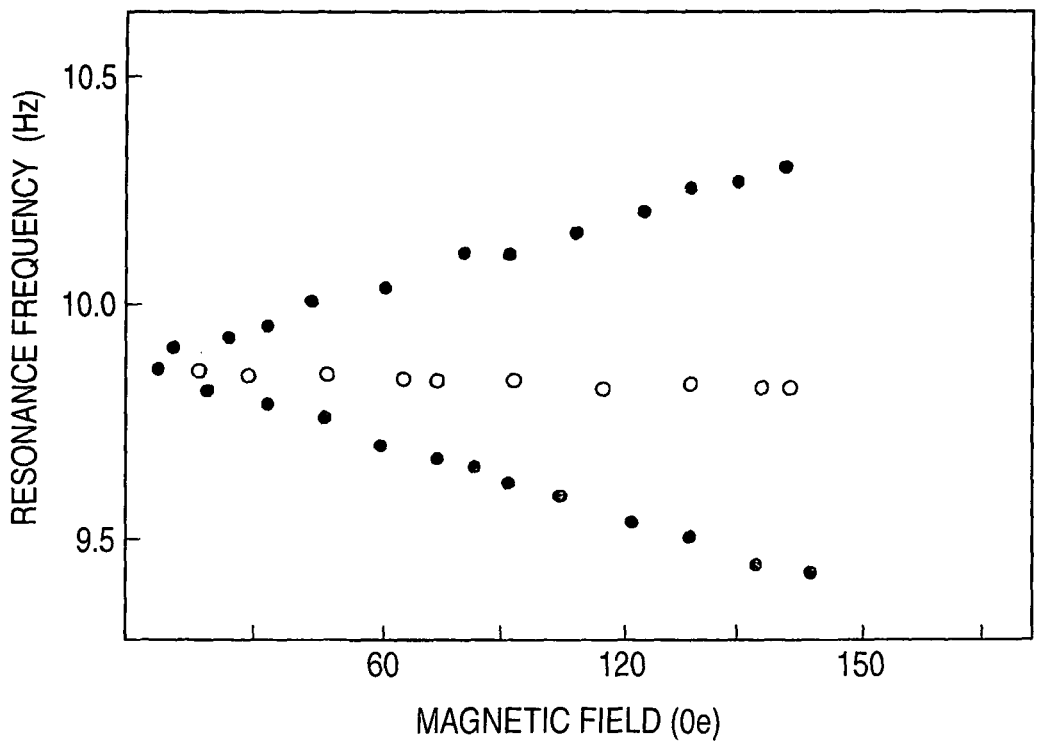
FIG. 5 is a view showing magnetic field dependence of a resonance frequency of an antiferromagnetic laminate film employed in the first embodiment.

First, the Si substrate having the artificial antiferromagnetic film formed thereon was set in a cavity resonator which can vary a resonance frequency. A magnetic field was applied into a plane of the laminate film, thereby measuring applied magnetic field dependence of the resonance frequency. The result of measurement is shown in FIG. 5.

Solid circles depict a case where the external magnetic field was applied in an easy axis direction of the antiferromagnetic laminate film, and outlined circles depict a case where a magnetic field was applied perpendicular to the easy axis. FIG. 5 shows that the resonance frequency achieved at a magnetic field of 0 is about 10 GHz. When the magnetic field was applied perpendicular to the easy magnetizing axis, the resonance frequency is understood to remain substantially unchanged. The following equation (11) provided below is derived from the resonance frequency.

$$\frac{\gamma}{2\pi}\sqrt{H_E H_A} \cong 9.85 \text{ GHz} \quad (11)$$

Here, $H_E$ denotes an exchange magnetic field acting between the Co layers of the artificial antiferromagnetic material; and $H_A$ denotes an anisotropic magnetic field. Further, when the magnetic field is applied perpendicular to the easy axis of the Co layers, no substantial changes are understood to arise in the resonance frequency. In contrast, a half breadth of a resonance line was about 0.3 GHz, and a Gilbert attenuation coefficient determined from this value was about 0.015.

<Fabrication and Evaluation of a High-Frequency Oscillation Element>

Figure 3:
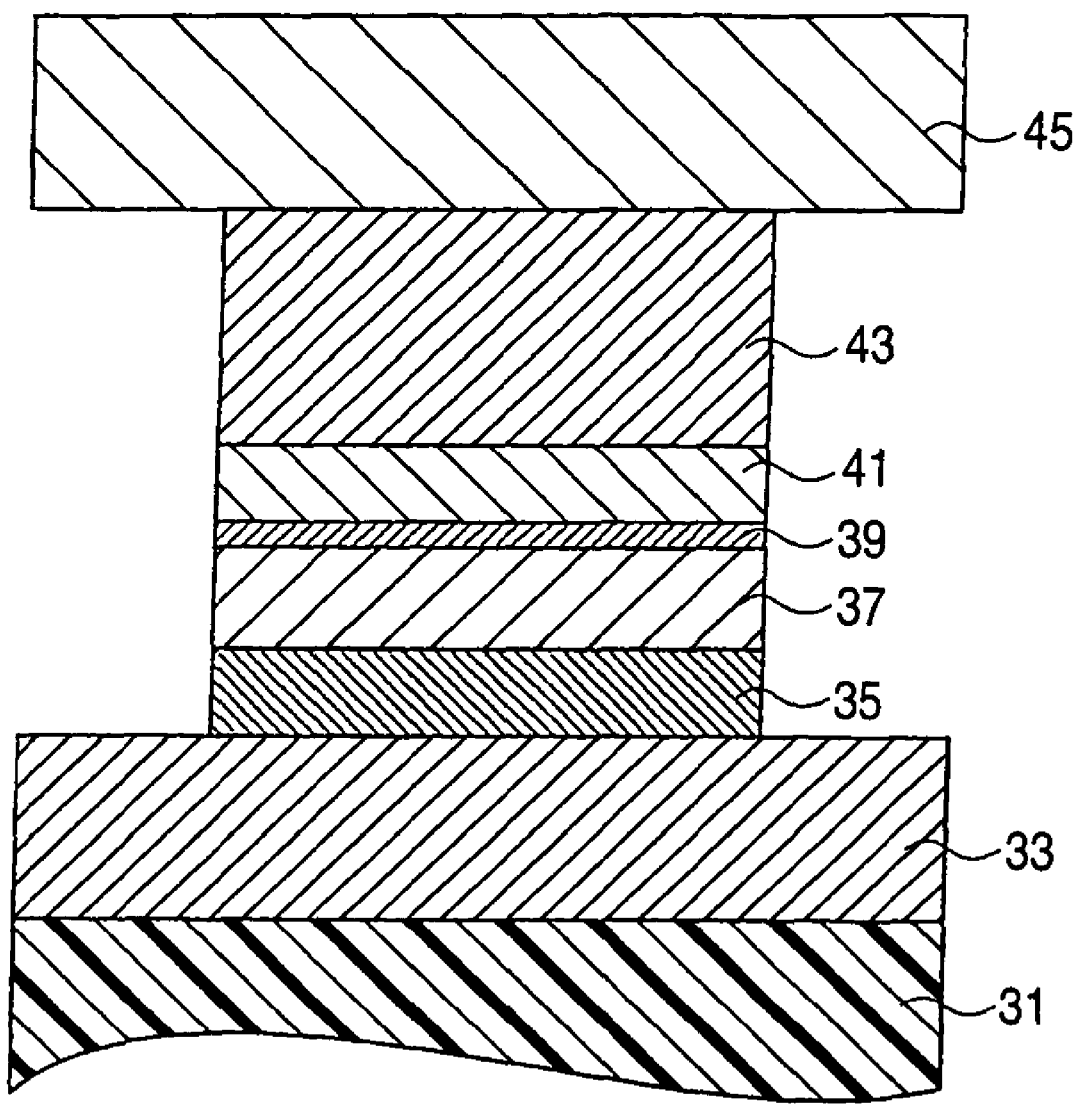
FIG. 3 is a diagrammatic cross-sectional view of a laminate film according to the first embodiment.

There was fabricated an element in which the Co layer 35 having a thickness of 50 nm in the element shown in FIG. 3 was replaced with the foregoing artificial antiferromagnetic film (Fe 1 nm/Cr 0.7 nm)[10].

Sputtering was used for forming the artificial antiferromagnetic film in a magnetic field of about 10000 e. The direction in which the external magnetic field is applied at the time of formation of the laminate film in the magnetic field by means of sputtering was made parallel to the surfaces of the respective layers. The direction of the magnetic field employed at the time of formation of the Fe layer having a thickness of 1 nm of the ferromagnetic material was made perpendicular to the direction of the magnetic field. The element was processed to a junction size of about 100 nm×100 nm by means of electron lithography and Ar ion milling. A SiO$_2$ layer was formed as an interlayer insulation film, and the Cu layer was formed as an upper electrode.

Figure 6:
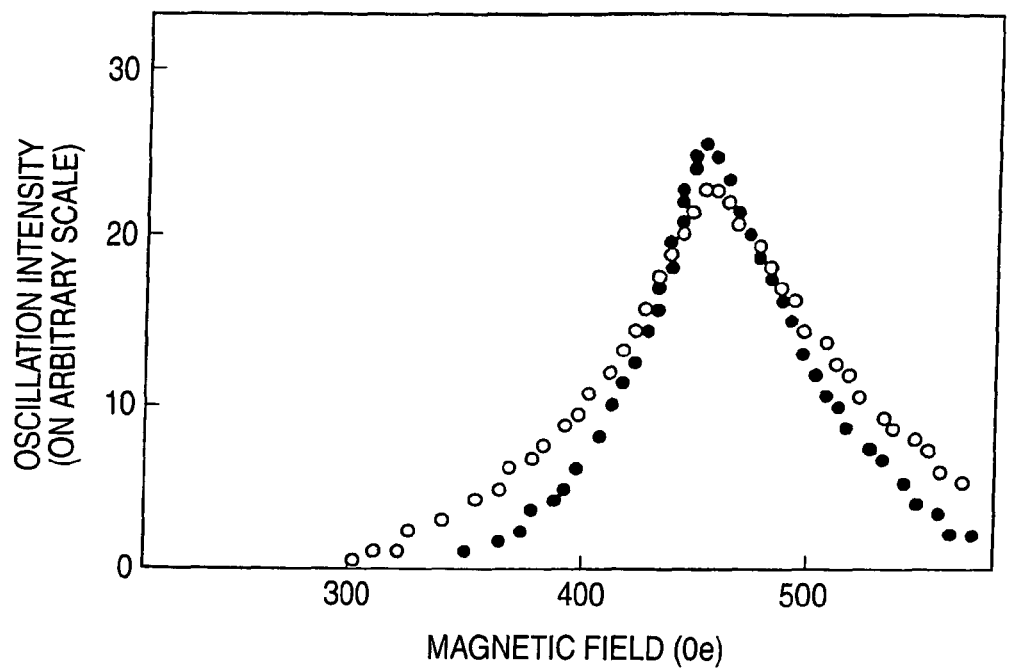
FIG. 6 is an observation view of microwave oscillation of the high-frequency oscillation element of the first embodiment.

Electrodes are connected to this element and set in the cavity resonator, and the resonator was controlled such that the resonance frequency assumes a value of about 9.85 GHz. Microwave oscillation of the element was observed by means of applying the external magnetic field to the direction of the easy axis of the micro-ferromagnetic material while the current remained flowing through element. The result of oscillation is shown in FIG. 6.

When a magnetization fluctuation of the ferromagnetic material film—to which the magnetic field of about 4500 e was applied—coincided with the resonance frequency of the artificial antiferromagnetic film, the strongest oscillation was observed. Solid circles depict a case where an electric current of 100 µA was caused to flow the element, and outlined circles depict a case where an electric current of 500 µA was caused to flow the element. The solid circles show intensity which is five times the observed value.

Figure 7:
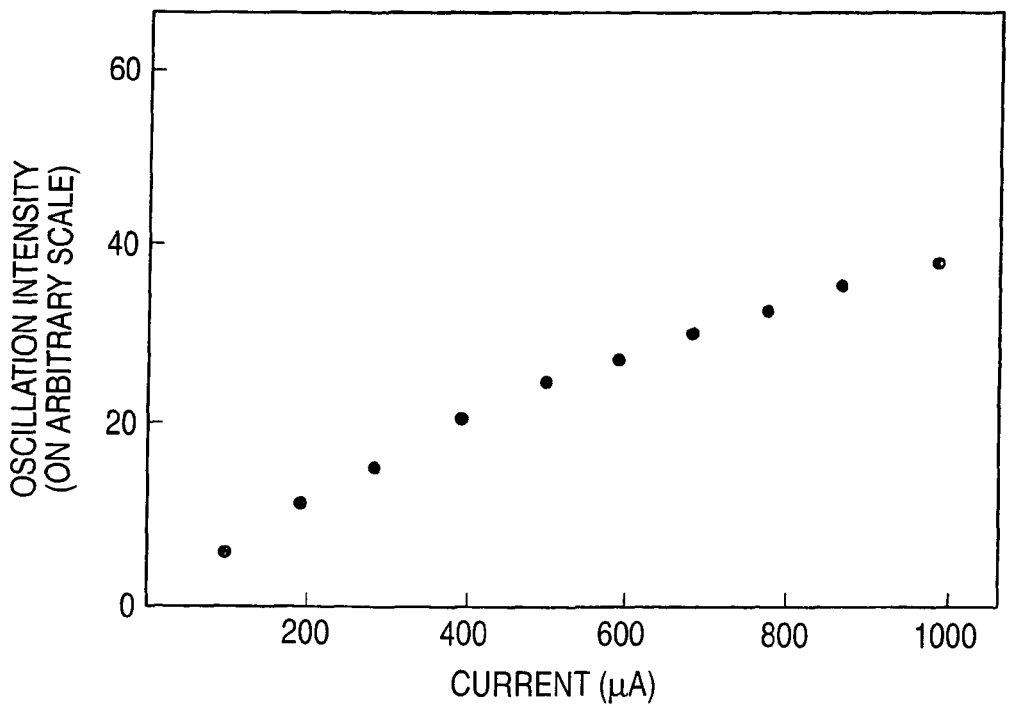
FIG. 7 is a view showing a relationship between a current value and oscillation peak intensity, both pertaining to the high-frequency oscillation element of the first embodiment.

Oscillation intensity increases with an increase in current. However, in the case of an electric current of 500 µA, the peak intensity is smaller than the value which is five times the peak intensity, by about 10%. Concurrently, an increase in the width of oscillation is found. FIG. 7 shows a relationship between the current value and the peak oscillation strength. A saturation phenomenon of oscillation intensity is observed with an increase in the current of the element. However, the result is conceived to be attributable to the Gilbert attenuation coefficient α increasing with an increase in the effective magnetic field in the artificial antiferromagnetic film.

The embodiments and examples of the invention have been described thus far. However, the present invention is not limited to the embodiments and examples and susceptible to various alternations within the scope of the gist of the invention described in claims.

The present invention is also susceptible to various modifications within the scope of the gist of the embodiments in an embodiment stage.

Various inventions can be made by means of an appropriate combination of a plurality of constituent elements described in the embodiments. For instance, some of all the constituent elements described in each of the embodiments may be deleted. Moreover, constituent elements of different embodiments may be combined together arbitrarily.

As has been described, the high-frequency oscillation element can generate high-frequency oscillation through use of a minute junction area and is suitable for reproducing magnetic data compatible with high-density recording.

What is claimed is:

1. A high-frequency oscillation element, comprising:
   a first magnetic material exhibiting thermal fluctuation of magnetization which generates spin fluctuation in conduction electrons;
   a nonmagnetic conductive material which is laminated on the first magnetic material and transfers the conduction electrons;
   a second magnetic material which is laminated on the nonmagnetic conductive material, generates magnetic resonance upon injection of the conduction electrons, and effects magnetic dipole interaction to magnetization of a neighboring magnetic area by means of magnetic vibration stemming from the magnetic resonance, wherein the second magnetic material comprises a plurality of ferromagnetic layers and a plurality of nonmagnetic layers alternately sandwiched between the plurality of the ferromagnetic layers, and wherein the ferromagnetic layers adjacent to each other with a respective one of the nonmagnetic layers therebetween are antiferromagnetically coupled to each other;
   a first electrode electrically coupled with the first magnetic material;
   a second electrode electrically coupled with the second magnetic material; and
   a non-magnetic barrier provided between the second magnetic material and the second electrode, the non-magnetic barrier being in contact with the second magnetic material and in contact with the second electrode;
   wherein the high-frequency oscillation element performs high-frequency oscillation by passing conduction electrons between the first magnetic material and the second magnetic material so that a magnetic procession occurs in at least one of the first magnetic material and the second magnetic material, thereby inducing magnetic resonance.

2. The high-frequency oscillation element according to claim 1, wherein the non-magnetic barrier is a layer comprising Cu, $Al_2O_3$, MgO, AlN, HfN, Si, Ge, or ZnS.

3. The high-frequency oscillation element according to claim 1, wherein the first magnetic material comprises any of Fe, Co, Ni, a Fe alloy, a Co alloy, and a Ni alloy.

4. The high-frequency oscillation element according to claim 1, wherein the nonmagnetic conductive material comprises any of Al, Pt, Au, Ag, Cu, Cr, Ru, and Pd.

5. The high-frequency oscillation element according to claim 1, wherein the second magnetic material comprises any of a CoCr alloy, a Co multilayer film, a CoCrPt alloy, a FePt alloy, a SmCo alloy, and a TbFeCo alloy.

6. The high-frequency oscillation element according to claim 1,
   wherein the plurality of ferromagnetic layers comprises any of Fe, Co, Ni, a Fe alloy, a Co alloy, and a Ni alloy; and
   wherein at least one of the nonmagnetic layers comprises any of Pt, Au, Ag, Cu, Cr, Ru, Rh, Mo, and W.

7. The high-frequency oscillation element according to claim 1, wherein each of the ferromagnetic layers has a thickness from 0.1 nm to 1 nm.

8. The high-frequency oscillation element according to claim 1, wherein a first magnetization of the first magnetic material thermally fluctuates, and wherein a second magnetization of the second magnetic material magnetically vibrates.

9. The high-frequency oscillation element according to claim 1, wherein the first electrode and the second electrode are structured to operate as heat radiating plates.

10. The high-frequency oscillation element according to claim 1, wherein the first electrode is directly in contact with the first magnetic material and radiates heat.

11. The high-frequency oscillation element according to claim 1, wherein the non-magnetic barrier is configured to confine injected conduction electrons in the second magnetic material.

12. A magnetic information recording head using a high-frequency oscillation element, the high-frequency oscillation element comprising:
   a first magnetic material exhibiting thermal fluctuation of magnetization which generates spin fluctuation in conduction electrons;
   a nonmagnetic conductive material which is laminated on the first magnetic material and transfers the conduction electrons;
   a second magnetic material which is laminated on the nonmagnetic conductive material, generates magnetic resonance upon injection of the conduction electrons, and effects magnetic dipole interaction to magnetization of a neighboring magnetic area by means of magnetic vibration stemming from the magnetic resonance, wherein the second magnetic material comprises a plurality of ferromagnetic layers and a plurality of nonmagnetic layers alternately sandwiched between the plurality of the ferromagnetic layers, and wherein the ferromagnetic layers adjacent to each other with a respective one of the nonmagnetic layers therebetween are antiferromagnetically coupled to each other;
   a first electrode electrically coupled with the first magnetic material;
   a second electrode electrically coupled with the second magnetic material; and
   a non-magnetic barrier provided between the second magnetic material and the second electrode, the non-magnetic barrier being in contact with the second magnetic material and in contact with the second electrode;
   wherein the high-frequency oscillation element performs high-frequency oscillation by passing conduction electrons between the first magnetic material and the second magnetic material so that a magnetic procession occurs in at least one of the first magnetic material and the second magnetic material, thereby inducing magnetic resonance.

13. The magnetic information recording head according to claim 12, wherein a first magnetization of the first magnetic material thermally fluctuates, and wherein a second magnetization of the second magnetic material magnetically vibrates.

14. The magnetic information recording head according to claim 12, wherein the first electrode and the second electrode are structured to operate as heat radiating plates.

15. The magnetic information recording head according to claim 12, wherein the first electrode is directly in contact with the first magnetic material and radiates heat.

16. A magnetic storage device using a high-frequency oscillation element, the high-frequency oscillation element comprising:
   a first magnetic material exhibiting thermal fluctuation of magnetization which generates spin fluctuation in conduction electrons;
   a nonmagnetic conductive material which is laminated on the first magnetic material and transfers the conduction electrons;
   a second magnetic material which is laminated on the nonmagnetic conductive material, generates magnetic resonance upon injection of the conduction electrons, and effects magnetic dipole interaction to magnetization of a neighboring magnetic area by means of magnetic vibration stemming from the magnetic resonance, wherein the second magnetic material comprises a plurality of ferromagnetic layers and a plurality of nonmagnetic layers alternately sandwiched between the plurality of the ferromagnetic layers, and wherein the ferromagnetic layers adjacent to each other with a respective one of the nonmagnetic layers therebetween are antiferromagnetically coupled to each other;

a first electrode electrically coupled with the first magnetic material;

a second electrode electrically coupled with the second magnetic material; and a non-magnetic barrier provided between the second magnetic material and the second electrode, the non-magnetic barrier being in contact with the second magnetic material and in contact with the second electrode;

wherein the high-frequency oscillation element performs high-frequency oscillation by passing conduction electrons between the first magnetic material and the second magnetic material so that a magnetic procession occurs in at least one of the first magnetic material and the second magnetic material, thereby inducing magnetic resonance.

17. The magnetic storage device according to claim 16, wherein a first magnetization of the first magnetic material thermally fluctuates, and wherein a second magnetization of the second magnetic material magnetically vibrates.

18. The magnetic storage device according to claim 16, wherein the first electrode and the second electrode are structured to operate as heat radiating plates.

19. The magnetic storage device according to claim 16, wherein the first electrode is directly in contact with the first magnetic material and radiates heat.

20. The magnetic storage device according to claim 16, wherein the non-magnetic barrier is configured to confine injected conduction electrons in the second magnetic material.

* * * * *